(12) United States Patent
Chen et al.

(10) Patent No.: US 10,685,935 B2
(45) Date of Patent: Jun. 16, 2020

(54) FORMING METAL BONDS WITH RECESSES

(71) Applicant: Taiwan Semiconductor Manufacturing Company, Ltd., Hsinchu (TW)

(72) Inventors: Ming-Fa Chen, Taichung (TW); Hsien-Wei Chen, Hsinchu (TW); Sung-Feng Yeh, Taipei (TW); Wen-Chih Chiou, Zhunan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/886,033

(22) Filed: Feb. 1, 2018

(65) Prior Publication Data

US 2019/0148336 A1 May 16, 2019

Related U.S. Application Data

(60) Provisional application No. 62/586,345, filed on Nov. 15, 2017.

(51) Int. Cl.
*H01L 25/065* (2006.01)
*H01L 25/00* (2006.01)
(Continued)

(52) U.S. Cl.
CPC ........ *H01L 25/0652* (2013.01); *H01L 23/481* (2013.01); *H01L 23/5389* (2013.01);
(Continued)

(58) Field of Classification Search
CPC ..... H01L 25/0652; H01L 24/03; H01L 24/82; H01L 24/24; H01L 24/19; H01L 23/481; H01L 24/08; H01L 24/05; H01L 24/89; H01L 25/50; H01L 21/7684; H01L 21/76843; H01L 21/76877; H01L 21/76802; H01L 21/31116; H01L 21/78;
(Continued)

(56) References Cited

U.S. PATENT DOCUMENTS

| 4,818,728 A | 4/1989 | Rai et al. |
| 6,063,306 A * | 5/2000 | Kaufman ................ C09G 1/02 |
| | | 216/89 |

(Continued)

FOREIGN PATENT DOCUMENTS

| CN | 101261984 A | 9/2008 |
| CN | 104051288 A | 9/2014 |

(Continued)

*Primary Examiner* — Mohammad M Hoque
(74) *Attorney, Agent, or Firm* — Slater Matsil, LLP

(57) ABSTRACT

A method includes forming a first device die, which includes depositing a first dielectric layer, and forming a first metal pad in the first dielectric layer. The first metal pad includes a recess. The method further includes forming a second device die including a second dielectric layer and a second metal pad in the second dielectric layer. The first device die is bonded to the second device die, with the first dielectric layer being bonded to the second dielectric layer, and the first metal pad being bonded to the second metal pad.

20 Claims, 23 Drawing Sheets

(51) Int. Cl.
*H01L 23/00* (2006.01)
*H01L 23/48* (2006.01)
*H01L 23/538* (2006.01)
*H01L 21/78* (2006.01)
*H01L 21/311* (2006.01)
*H01L 21/768* (2006.01)
*H01L 21/321* (2006.01)

(52) U.S. Cl.
CPC .............. *H01L 24/03* (2013.01); *H01L 24/05* (2013.01); *H01L 24/08* (2013.01); *H01L 24/19* (2013.01); *H01L 24/24* (2013.01); *H01L 24/80* (2013.01); *H01L 24/82* (2013.01); *H01L 24/89* (2013.01); *H01L 25/50* (2013.01); *H01L 21/31116* (2013.01); *H01L 21/3212* (2013.01); *H01L 21/7684* (2013.01); *H01L 21/76802* (2013.01); *H01L 21/76843* (2013.01); *H01L 21/76877* (2013.01); *H01L 21/78* (2013.01); *H01L 24/96* (2013.01); *H01L 2224/03616* (2013.01); *H01L 2224/04105* (2013.01); *H01L 2224/05556* (2013.01); *H01L 2224/05582* (2013.01); *H01L 2224/05647* (2013.01); *H01L 2224/08058* (2013.01); *H01L 2224/08145* (2013.01); *H01L 2224/12105* (2013.01); *H01L 2224/24145* (2013.01); *H01L 2224/802* (2013.01); *H01L 2224/80895* (2013.01); *H01L 2224/80896* (2013.01); *H01L 2224/82896* (2013.01); *H01L 2224/82897* (2013.01); *H01L 2224/94* (2013.01); *H01L 2225/06513* (2013.01); *H01L 2225/06541* (2013.01); *H01L 2225/06548* (2013.01); *H01L 2225/06555* (2013.01); *H01L 2225/06586* (2013.01)

(58) Field of Classification Search
CPC ........... H01L 24/96; H01L 2224/82897; H01L 2224/82896; H01L 2224/24145

USPC ........................................................ 257/778
See application file for complete search history.

(56) References Cited

U.S. PATENT DOCUMENTS

| | | | |
|---|---|---|---|
| 8,802,538 B1 | 8/2014 | Liu et al. | |
| 9,299,630 B2 | 3/2016 | Gowda et al. | |
| 10,026,646 B2 | 7/2018 | Chen | |
| 2005/0090104 A1* | 4/2005 | Yang | C09G 1/02 438/689 |
| 2005/0194565 A1* | 9/2005 | Kamiya | C09G 1/02 252/79.1 |
| 2007/0262468 A1* | 11/2007 | Nasu | H01L 23/48 257/778 |
| 2008/0217761 A1 | 9/2008 | Yang et al. | |
| 2011/0084403 A1* | 4/2011 | Yang | H01L 24/03 257/777 |
| 2014/0175614 A1* | 6/2014 | Wang | H01L 21/76898 257/621 |
| 2015/0364434 A1* | 12/2015 | Chen | H01L 23/498 257/773 |
| 2016/0197049 A1 | 7/2016 | Chen et al. | |
| 2018/0151522 A1 | 5/2018 | Yang et al. | |

FOREIGN PATENT DOCUMENTS

| | | |
|---|---|---|
| CN | 104900543 A | 9/2015 |
| CN | 104916605 A | 9/2015 |
| JP | 201100948 A | 1/2011 |
| KR | 20080082545 A | 9/2008 |
| KR | 20140016192 A | 2/2014 |
| KR | 20150106815 A | 9/2015 |
| TW | 201719842 A | 6/2017 |

* cited by examiner

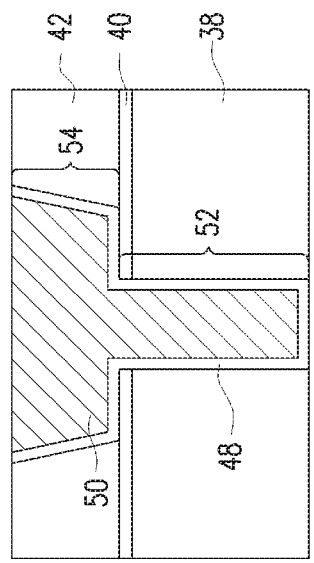
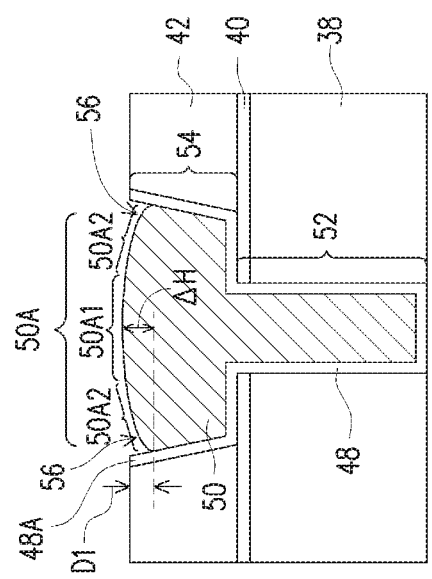
FIG. 16B
FIG. 16A

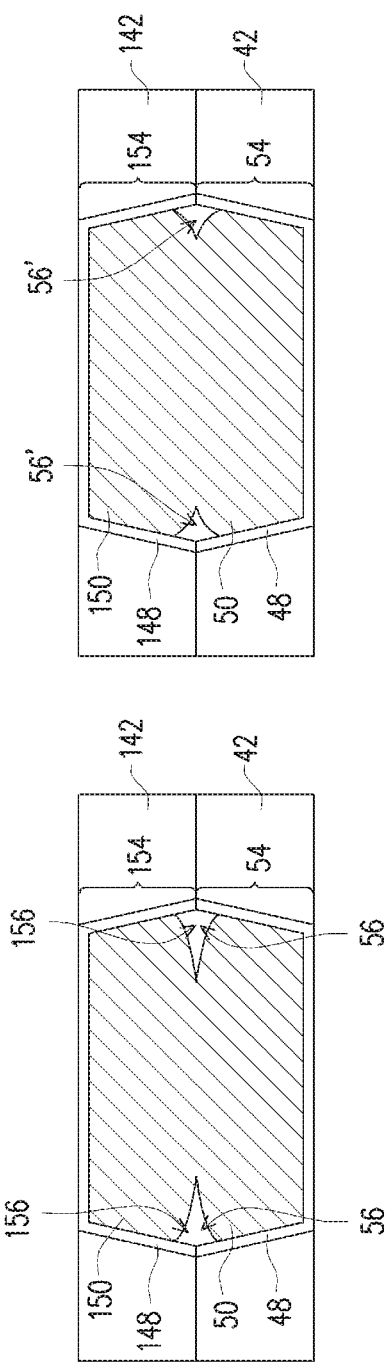

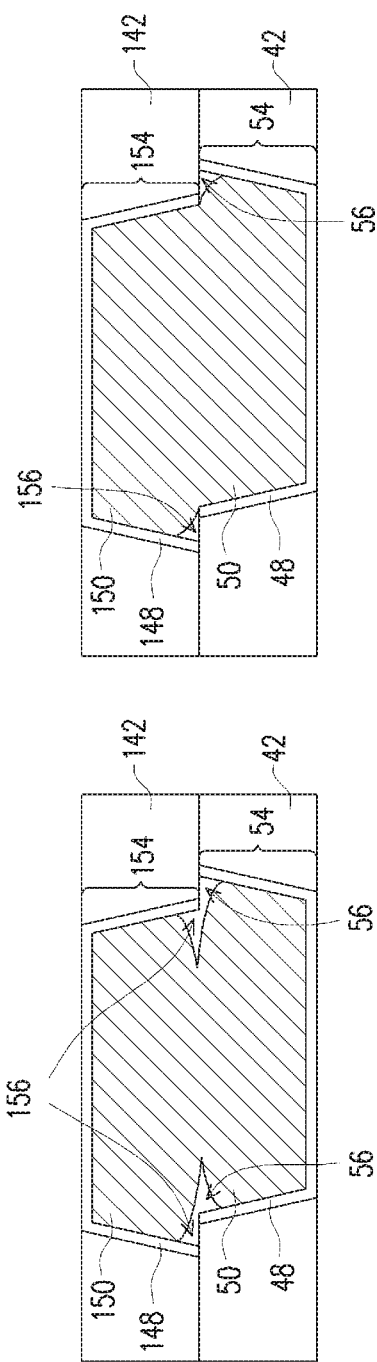

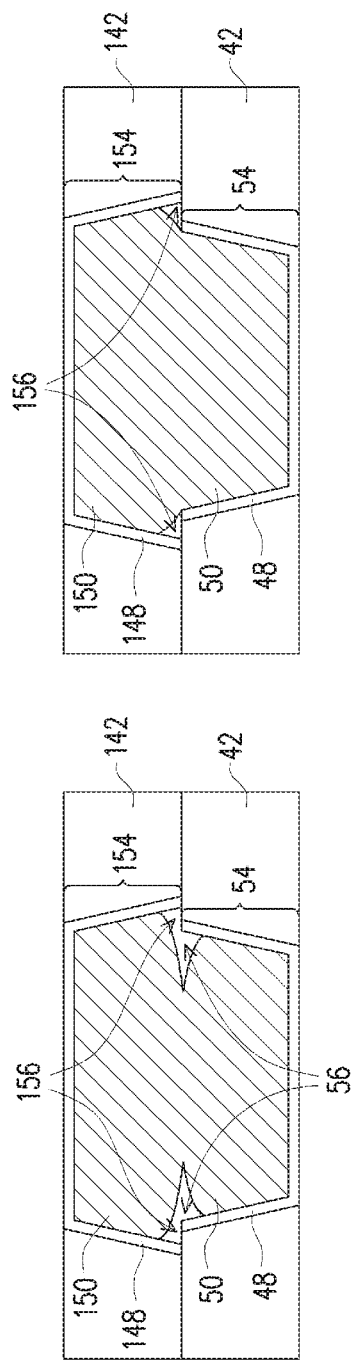

FORMING METAL BONDS WITH RECESSES

PRIORITY CLAIM AND CROSS-REFERENCE

This application claims the benefit of the following provisionally filed U.S. Patent application: Application Ser. No. 62/586,345, filed Nov. 15, 2017, and entitled "Forming Metal Bonds with Recesses," which application is hereby incorporated herein by reference.

BACKGROUND

The packages of integrated circuits are becoming increasing complex, with more device dies packaged in the same package to achieve more functions. For example, System on Integrate Chip (SoIC) has been developed to include a plurality of device dies such as processors and memory cubes in the same package. The SoIC can include device dies formed using different technologies and have different functions bonded to the same device die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 16A and 16B through 27 illustrate the cross-sectional views of metal bonds in accordance with some embodiments.

DETAILED DESCRIPTION

Figure 1:
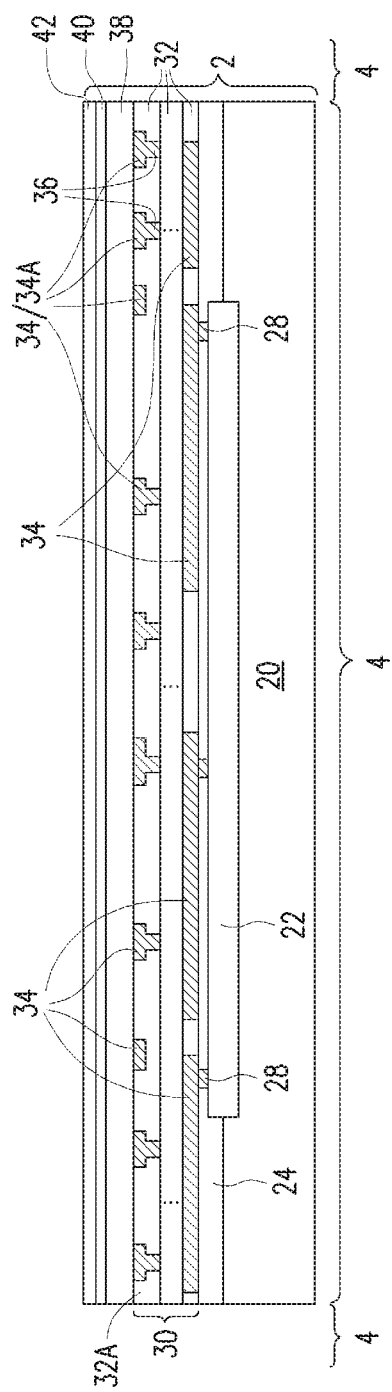
FIGS. 1 through 14 are cross-sectional views of intermediate stages in the manufacturing of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A System on Integrate Chip (SoIC) package and the method of forming the same are provided in accordance with various embodiments. The intermediate stages of forming the SoIC package are illustrated in accordance with some embodiments. Some variations of some embodiments are discussed. Throughout the various views and illustrative embodiments, like reference numbers are used to designate like elements. It is appreciated that although the formation of SoIC packages is used as examples to explain the concept of the embodiments of the present disclosure, the embodiments of the present disclosure are readily applicable to other bonding methods and structures in which metal pads and vias are bonded to each other.

Figure 28:
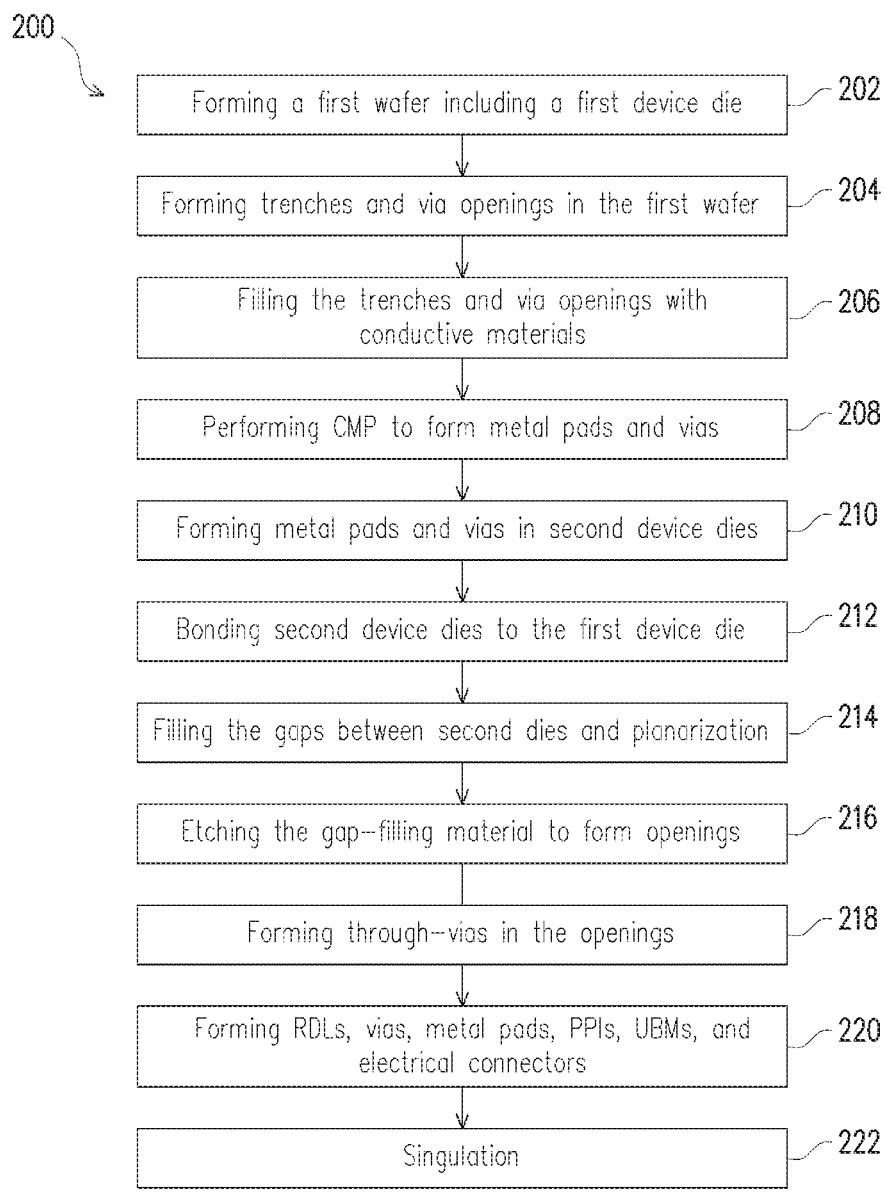
FIG. 28 illustrates a process flow for forming a package in accordance with some embodiments.

FIGS. 1 through 14 illustrate the cross-sectional views of intermediate stages in the formation of an SoIC package in accordance with some embodiments of the present disclosure. The steps shown in FIGS. 1 through 14 are also reflected schematically in the process flow 200 shown in FIG. 28.

FIG. 1 illustrates the cross-sectional view in the formation of package component 2. The respective process is illustrated as step 202 in the process flow shown in FIG. 28. In accordance with some embodiments of the present disclosure, package component 2 is a device wafer including active devices 22 such as transistors and/or diodes, and possibly passive devices such as capacitors, inductors, resistors, or the like. Package component 2 may include a plurality of chips 4 therein, with one of chips 4 illustrated. Chips 4 are alternatively referred to as (device) dies hereinafter. In accordance with some embodiments of the present disclosure, device die 4 is a logic die, which may be a Central Processing Unit (CPU) die, a Micro Control Unit (MCU) die, an input-output (IO) die, a BaseBand (BB) die, an Application processor (AP) die, or the like. Device die 4 may also be a memory die such as a Dynamic Random Access Memory (DRAM) die or a Static Random Access Memory (SRAM) die.

In accordance with alternative embodiments of the present disclosure, package component 2 includes passive devices (with no active devices). In subsequent discussion, a device wafer is discussed as an package component 2. The embodiments of the present disclosure may also be applied to other types of package components such as interposer wafers.

In accordance with some embodiments of the present disclosure, the wafer 2 includes semiconductor substrate 20 and the features formed at a top surface of semiconductor substrate 20. Semiconductor substrate 20 may be formed of crystalline silicon, crystalline germanium, crystalline silicon germanium, and/or a III-V compound semiconductor such as GaAsP, AlInAs, AlGaAs, GaInAs, GaInP, GaInAsP, and the like. Semiconductor substrate 20 may also be a bulk silicon substrate or a Silicon-On-Insulator (SOI) substrate. Shallow Trench Isolation (STI) regions (not shown) may be formed in semiconductor substrate 20 to isolate the active regions in semiconductor substrate 20. Although not shown, through-vias may be formed to extend into semiconductor substrate 20, and the through-vias are used to electrically inter-couple the features on opposite sides of wafer 2.

In accordance with some embodiments of the present disclosure, wafer 2 includes integrated circuit devices 22, which are formed on the top surface of semiconductor substrate 20. Exemplary integrated circuit devices 22 may include Complementary Metal-Oxide Semiconductor (CMOS) transistors, resistors, capacitors, diodes, and/or the like. The details of integrated circuit devices 22 are not illustrated herein. In accordance with alternative embodiments, wafer 2 is used for forming interposers, in which substrate 20 may be a semiconductor substrate or a dielectric substrate.

Inter-Layer Dielectric (ILD) 24 is formed over semiconductor substrate 20, and fills the space between the gate stacks of transistors (not shown) in integrated circuit devices 22. In accordance with some embodiments, ILD 24 is formed of Phospho Silicate Glass (PSG), Boro Silicate Glass (BSG), Boron-Doped Phospho Silicate Glass (BPSG), Fluorine-Doped Silicate Glass (FSG), Tetra Ethyl Ortho Silicate (TEOS), or the like. ILD 24 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like.

Contact plugs 28 are formed in ILD 24, and are used to electrically connect integrated circuit devices 22 to overlying metal lines 34 and vias 36. In accordance with some embodiments of the present disclosure, contact plugs 28 are formed of a conductive material selected from tungsten, aluminum, copper, titanium, tantalum, titanium nitride, tantalum nitride, alloys therefore, and/or multi-layers thereof. The formation of contact plugs 28 may include forming contact openings in ILD 24, filling a conductive material(s) into the contact openings, and performing a planarization (such as Chemical Mechanical Polish (CMP) process) to level the top surfaces of contact plugs 28 with the top surface of ILD 24.

Over ILD 24 and contact plugs 28 resides interconnect structure 30. Interconnect structure 30 includes dielectric layers 32, and metal lines 34 and vias 36 formed in dielectric layers 32. Dielectric layers 32 are alternatively referred to as Inter-Metal Dielectric (IMD) layers 32 hereinafter. In accordance with some embodiments of the present disclosure, at least the lower ones of dielectric layers 32 are formed of a low-k dielectric material having a dielectric constant (k-value) lower than about 3.0 or about 2.5. Dielectric layers 32 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 32 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of dielectric layers 32 includes depositing a porogen-containing dielectric material, and then performing a curing process to drive out the porogen, and hence the remaining dielectric layers 32 becomes porous. Etch stop layers (not shown), which may be formed of silicon carbide, silicon nitride, or the like, are formed between IMD layers 32, and are not shown for simplicity.

Metal lines 34 and vias 36 are formed in dielectric layers 32. The metal lines 34 at a same level are collectively referred to as a metal layer hereinafter. In accordance with some embodiments of the present disclosure, interconnect structure 30 includes a plurality of metal layers that are interconnected through vias 36. Metal lines 34 and vias 36 may be formed of copper or copper alloys, and they can also be formed of other metals. The formation process may include single damascene and dual damascene processes. In an single damascene process, a trench is first formed in one of dielectric layers 32, followed by filling the trench with a conductive material. A planarization process such as a CMP process is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. The conductive material may include a diffusion barrier and a copper-containing metallic material over the diffusion barrier. The diffusion barrier may include titanium, titanium nitride, tantalum, tantalum nitride, or the like.

Metal lines 34 include metal lines 34A, which are sometimes referred to as top metal lines. Top metal lines 34A are also collectively referred to as being a top metal layer. The respective dielectric layer 32A may be formed of a non-low-k dielectric material such as Un-doped Silicate Glass (USG), silicon oxide, silicon nitride, or the like. Dielectric layer 32A may also be formed of a low-k dielectric material, which may be selected from the similar materials of the underlying IMD layers 32.

In accordance with some embodiments of the present disclosure, dielectric layers 38, 40, and 42 are formed over the top metal layer. Dielectric layers 38 and 42 may be formed of silicon oxide, silicon oxynitride, silicon oxycarbide, or the like, Dielectric layer 40 is formed of a dielectric material different from the dielectric material of dielectric layer 42. For example, dielectric layer 42 may be formed of silicon nitride, silicon carbide, or the like.

Figure 2:
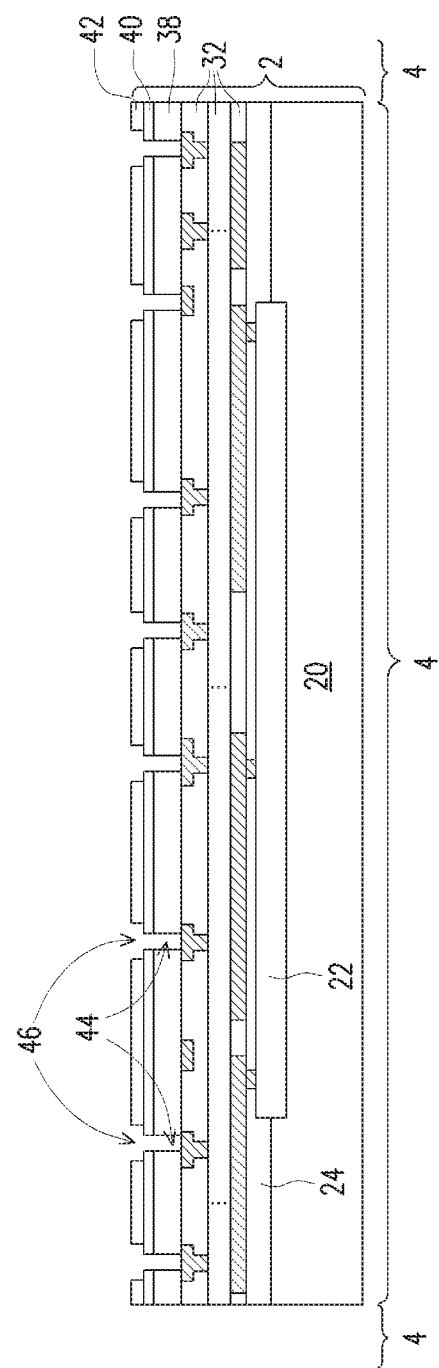

Referring to FIG. 2, via openings 44 and trenches 46 are formed. The respective process is illustrated as step 204 in the process flow shown in FIG. 28. To form via openings 44 and trenches 46, photo resists (not shown) and/or hard masks (not shown) may be formed and patterned over dielectric layer 42 to aid the formation of via openings 44 and trenches 46. In accordance with some embodiments of the present disclosure, an anisotropic etch is performed to form trenches 46, and the etch stops on etch stop layer 40. Another anisotropic etch is then performed to form via openings 44 by etching the exposed etch stop layer 40 and the underlying portions of dielectric layer 38. In accordance with some embodiments of the present disclosure, etch stop layer 40 is not formed, and via openings 44 and trenches 46 are formed in a single dielectric layer. The etching may be performed using time mode to allow the etching (for forming trenches 46) to stop at an intermediate level between a top surface and a bottom surface of the single dielectric layer.

Figure 3:
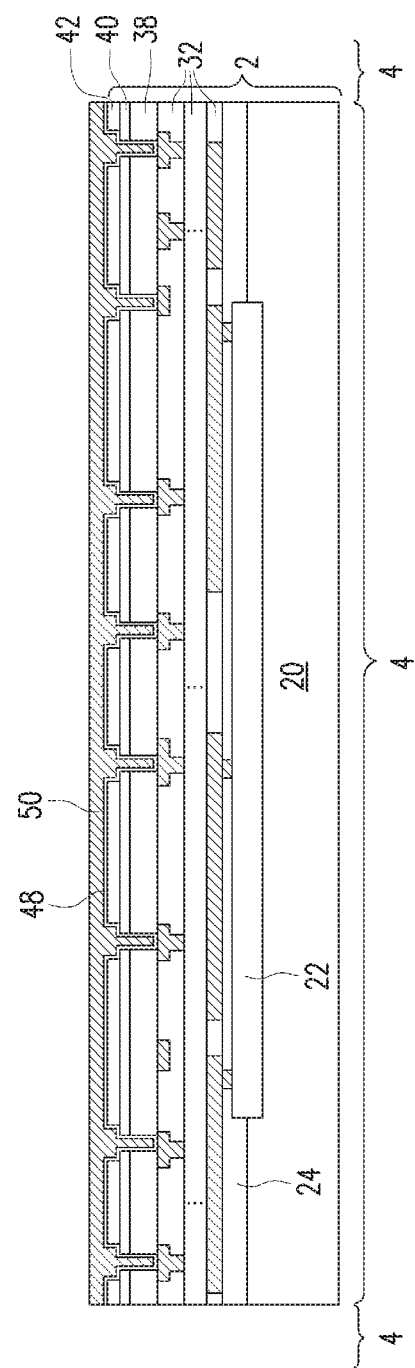

FIG. 3 illustrates the filling of conductive materials. The respective process is illustrated as step 206 in the process flow shown in FIG. 28. Conductive diffusion barrier 48 is first formed. In accordance with some embodiments of the present disclosure, diffusion barrier 48 is formed of titanium, titanium nitride, tantalum, tantalum nitride, or the like. Diffusion barrier 48 may be formed, for example, using Atomic Layer Deposition (ALD), Physical Vapor Deposition (PVD), or the like. Diffusion barrier 48 comprises first portions over surface dielectric layer 42, and second portions on the bottoms and sidewalls of trenches 46 and via openings 44.

Next, metallic material 50 is deposited, for example, through Electro-Chemical Plating (ECP). Metallic material 50 fills the remaining portions of trenches 46 and via openings 44. Metallic material 50 further includes some portions over the top surface of surface dielectric layer 42. Metallic material 50 may include copper or copper alloy, or another metallic material that can diffuse in a subsequent anneal process, so that metal-to-metal direct bond may be formed.

Figure 4:
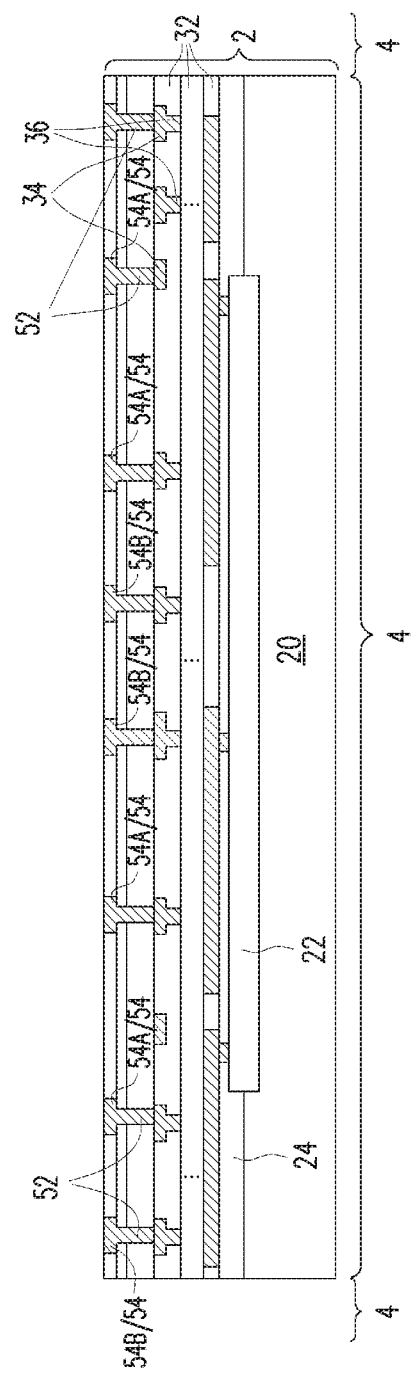

Next, as shown in FIG. 4, a planarization process such as a Chemical Mechanical Polish (CMP) process is performed to remove excess portions of metallic material 50 and diffusion barrier 48, until dielectric layer 42 is exposed. The respective process is illustrated as step 208 in the process flow shown in FIG. 28. The remaining portions of diffusion barrier 48 and metallic material 50 include vias 52 and metal pads 54 (including 54A and 54B). FIG. 4 illustrates the metal pads for bonding. It is appreciated that metal lines may also be formed simultaneously as metal pads 54. Metal pads 54 includes metal pads 54A, which are used for bonding to device dies, and metal pads 54B, which are used for through-vias to land.

FIG. 16A illustrates a cross-sectional view of via 52 and metal pad 54 in accordance with some embodiments of the present disclosure. Each of metal pad 54 and via 52 includes a portion of diffusion barrier 48 and a portion of metallic material 50 encircled by the respective portion of diffusion barrier 48. Metallic material 50 may include edge portions and a middle portion between the edge portions. The top surface 50A1 of the middle portion is higher than the top surfaces 50A2 of the edge portions. In accordance with some embodiments of the present disclosure, top surface 50A of metallic material 50 include curved portions. The top surface 50A1 of the middle portion may be curved or may be planar. The top surfaces 50A2 of the edge portions may be continuously curved (rounded). The height difference ΔH between the highest point and the lowest point of top surface 50A may be in the range between about 100 Å and about 500 Å, and may be in the range between about 100 Å and about 200 Å.

In accordance with some embodiments of the present disclosure, diffusion barrier 48 has top edge 48A, which is either level with, slightly higher than, or slightly lower than, the highest point of top surface 50A of metallic material 50, depending on the CMP process. Edge surface portions 50A2 may be lower than top edge 48A, so that recesses 56 are formed. In accordance with some embodiments, recess depth D1 is greater than about 100 Å, and may be in the range between about 100 Å and about 500 Å, and may further be in the range between about 100 Å and about 200 Å. Top edge 48A of diffusion barrier 48 may also be level with or slightly lower than the top surface of dielectric layer 42. In a top view of bond pad 54, recesses 56 may form a ring proximal edges of bond pad 54. The sidewalls of diffusion barrier 48 exposed to recesses 56 may also form a ring.

To achieve recesses 56, the CMP process is adjusted. In accordance with some embodiments of the present disclosure, the slurry for the CMP process includes oxalic acid ($H_2C_2O_4$) and acetic acid ($CH_3COOH$). The pH value of the slurry is adjusted to be lower than about 4.0, and may be in the range between about 2.0 and about 4.0, which may be achieved by adjusting the concentration of oxalic acid and acetic acid to a proper amount. In accordance with some embodiments, the weight percentage of oxalic acid in the slurry is in the range between about 0.01% percent and about 2% percent, and the weight percentage of acetic acid in the slurry is in the range between about 0.1% percent and about 2% percent. The ratio of $W_{Oxalic}/W_{acetic}$ may be in the range between about 1:1 and about 1:10, wherein $W_{Oxalic}$ represents the weight percentage of oxalic acid in the slurry, and $W_{acetic}$ represents the weight percent of the acetic acid in the slurry. Furthermore, the slurry may include an oxalic chelate such as Cu-oxalic chelate ($Cu—C_2O_4$). The weight percentage of the oxalic chelate may be in the range between about 0.01% and about 0.1% in accordance with some embodiments. With these process conditions, recesses 56 as shown in FIG. 16A may be formed. The slurry may also include an abrasive such as silicon oxide particles, aluminum oxide particles, or the like. In addition, the process conditions such as the temperature of the wafer during the CMP, the rotation speed of wafer and polishing pad, the abrasives in the slurry, etc., may be adjusted to form recesses 56.

In accordance with alternative embodiments of the present disclosure, metal pad 54 and via 52 as shown in FIG. 16B is formed. The top surfaces of metallic material 50, diffusion barrier 48, and dielectric layer 42 are planar or substantially planar (for example, with height differences smaller than about 20 Å). In accordance with some embodiments of the present disclosure, the slurry for achieving such a profile may be free from acetic acid, oxalic acid, and the oxalic chelate. The pH value of the slurry is also in the range between about 7.0 and about 10.0 in accordance with some embodiments. The slurry may also include an abrasive such as silicon oxide particles, aluminum oxide particles, or the like.

Device die 4 may also include metal pads such as aluminum or aluminum copper pads, which may be formed in dielectric layer 38 (FIG. 4) in accordance with some embodiments. The aluminum pads are not shown for simplicity.

In accordance with some embodiments of the present disclosure, there is no organic dielectric material such as polymer layer in wafer 2. Organic dielectric layers typically have high Coefficients of Thermal Expansion (CTEs), which may be 10 ppm/C° or higher. This is significantly greater than the CTE of silicon substrate (such as substrate 20), which is about 3 ppm/C°. Accordingly, organic dielectric layers tend to cause the warpage of wafer 2. Not including organic materials in wafer 2 advantageously reduces the CTE mismatch between the layers in wafer 2, and results in the reduction in warpage. Also, not including organic materials in wafer 2 makes the formation of fine-pitch metal lines (such as 72 in FIG. 10) and high-density bond pads possible, and results in the improvement in the routing ability.

It is appreciated that the metal lines formed in the same layer and simultaneously as metal pad 54 may have similar cross-sectional view shape as the respective metal pad as shown in FIGS. 16A, 16B, 17A, and 17B. Also, in previously discussed embodiments, metal pads 54 are formed using a dual damascene process. In accordance with alternative embodiments of the present disclosure, metal pads 54 are formed using single a damascene process.

Figure 5:
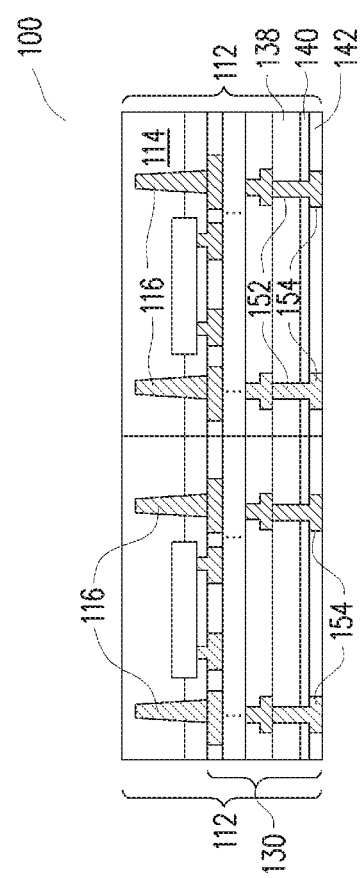

FIG. 5 illustrates the formation of wafer 100, which includes device dies 112 therein. In accordance with some embodiments of the present disclosure, device dies 112 are logic dies, which may be CPU dies, MCU dies, IO dies, Base-Band dies, or AP dies. Device dies 112 may also be memory dies. Wafer 100 includes semiconductor substrate 114, which may be a silicon substrate. Through-Silicon Vias (TSVs) 116, sometimes referred to as through-semiconductor vias or through-vias, are formed to penetrate through semiconductor substrate. TSVs 116 are used to connect the devices and metal lines formed on the front side (the illustrated bottom side) of semiconductor substrate 114 to the backside. Also, device dies 112 include interconnect structures 130 for connecting to the active devices and passive devices in device dies 112. Interconnect structures 130 include metal lines and vias (not shown).

Device die 112 may include dielectric layers 138 and 142, and etch stop layer 140 between dielectric layers 138 and 142. Bond pads 154 and vias 152 are formed in layers 138, 140, and 142. The respective process is illustrated as step 210 in the process flow shown in FIG. 28. In accordance with some embodiments of the present disclosure, all device dies such as dies 112 are free from organic dielectric materials such as polymers. The materials and the formation methods of dielectric layers 138 and 142, bond pads 154, and vias 152 may be similar to their corresponding parts in device die 4, and hence the details are not repeated herein.

Figure 17B:
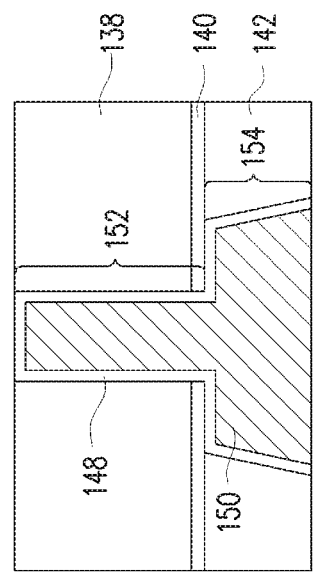
Figure 17A:
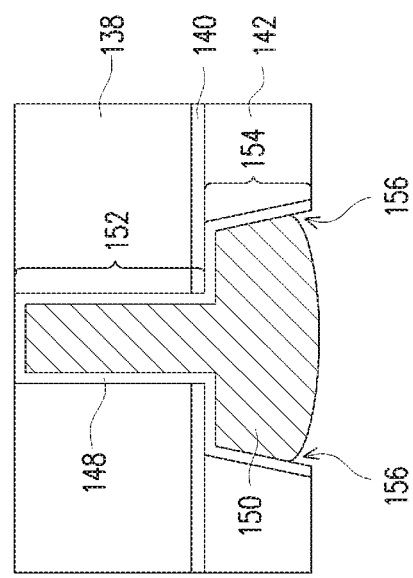

FIGS. 17A and 17B illustrate bond pads 154 and vias 152 in accordance with some embodiments. Bond pads 154 and vias 152 include diffusion barrier 148 and metallic material 150. The structures, the materials and the formation methods of FIG. 17A may be similar to that of bond pads 54 and vias 52 as shown in FIG. 16A. The top surface/edge profiles of diffusion barrier 148 and metallic material 150, and dielectric layer 142 may also be similar to what are shown and discussed for diffusion barrier 48, metallic material 50, and dielectric layer 42, respectively, in FIG. 16A, and hence are not repeated herein. Recesses 156 are formed, and the details of recesses 156 may be essentially the same as what are shown and discussed for recesses 56 (FIG. 16A). If viewed from the bottom of bond pad 154, recesses 156 may form a ring proximal the edges of bond pad 154, and some sidewalls of diffusion barrier 148 are also exposed to recesses 156, and may form a ring. The formation process (including the CMP process) of the structure shown in FIG. 17A may be similar to what are discussed referring to FIG. 16A.

The structures, the materials and the formation methods of FIG. 17B are similar to bond pads 54 and vias 52 respectively, as shown in FIG. 16B. The top surface/edge profiles of diffusion barrier 148 and metallic material 150, and dielectric layer 142 may be similar to what are shown and discussed for diffusion barrier 48, metallic material 50, and dielectric layer 42, respectively, in FIG. 16B, and hence are not repeated herein. No recesses are formed in metallic material 150.

Figure 6:
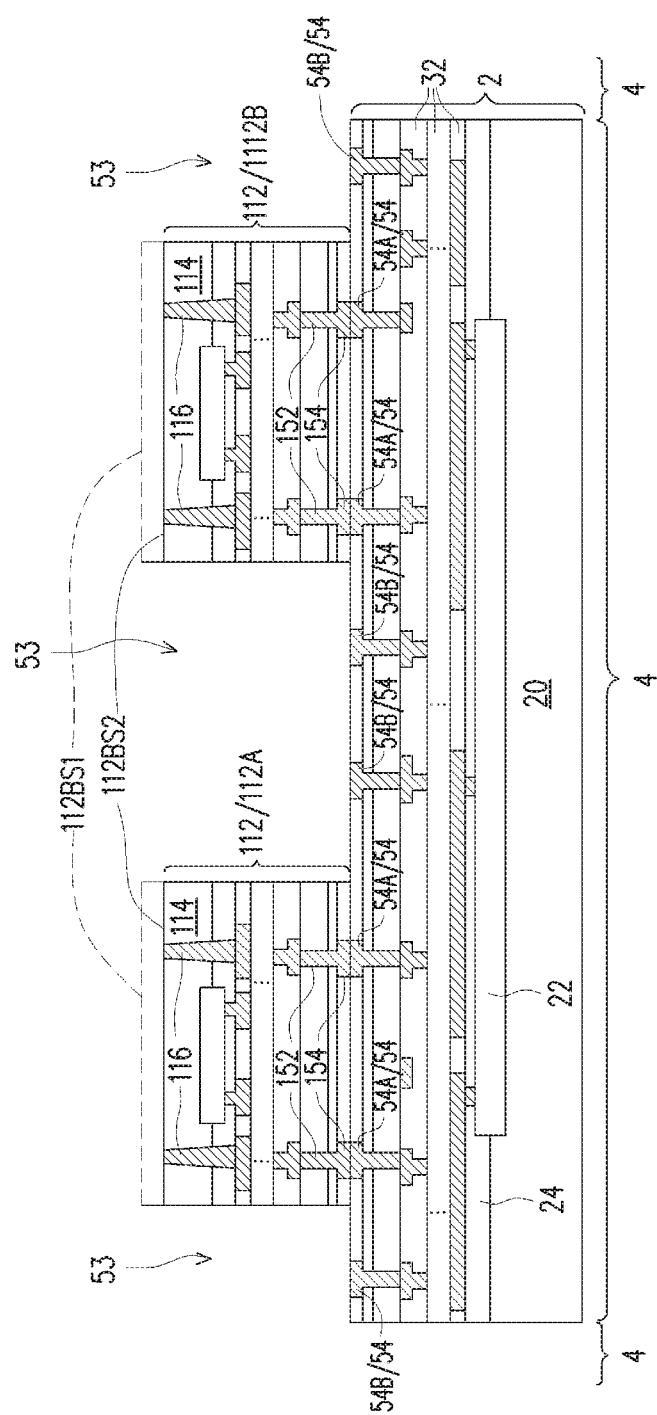

Referring back to FIG. 5, wafer 100 is singulated into a plurality of discrete device dies 112. FIG. 6 illustrates the bonding of device dies 112 (including 112A and 112B) to device die 4. The respective process is illustrated as step 212 in the process flow shown in FIG. 28. Each of the device dies 112A and 112B may be formed as having the structure (and using the similar formation method as discussed) as FIG. 5.

Device dies 112A and 112B may be identical to each other or may be different from each other. For example, device dies 112A and 112B may be different types of dies selected from the above-listed types. Furthermore, device dies 112 may be formed using different technologies such as 45 nm technology, 28 nm technology, 20 nm technology, or the like. Also, one of device dies 112 may be a digital circuit die, while the other may be an analog circuit die. Dies 4, 112A, and 112B in combination function as a system. Splitting the functions and circuits of a system into different dies such as dies 4, 112A, and 112B may optimize the formation of these dies, and may result in the reduction of manufacturing cost.

At least one of dies 4, 112A, and 112B has bond pads with recesses 56/156 as shown in FIGS. 16A and 17A. In accordance with some embodiments, bond pads 54 of die 4 has recesses 56 (FIG. 16A), and the bond pads of each of device dies 112A and 112B may either have the structure shown in FIG. 17A or the structure shown in FIG. 17B. In accordance with alternative embodiments of the present disclosure, bond pads 54 of die 4 have the structure shown in FIG. 16B (with no recess), and bond pads 154 of one or both of device dies 112A and 112B have recesses as shown in FIG. 17A. In FIGS. 18 through 25, the embodiments as shown have recesses in both of bond pads 54 and 154, and it is appreciated that either one of both of bond pads 54 and 154 may also be free from recesses.

The bonding of device dies 112 to die 4 (FIG. 6) may be achieved through hybrid bonding. For example, bond pads 154 are bonded to bond pads 54A through metal-to-metal direct bonding. In accordance with some embodiments of the present disclosure, the metal-to-metal direct bonding is copper-to-copper direct bonding. Bond pads 154 may have sizes greater than, equal to, or smaller than, the sizes of the respective bond pads 54A. Furthermore, dielectric layers 142 are bonded to surface dielectric layer 42 through dielectric-to-dielectric bonding, which may be fusion bonding, for example, with Si—O—Si bonds generated. Gaps 53 are left between neighboring device dies 112.

To achieve the hybrid bonding, device dies 112 are first pre-bonded to dielectric layer 42 and bond pads 54A by lightly pressing device dies 112 against die 4. After all device dies 112 are pre-bonded, an anneal is performed to cause the inter-diffusion of the metals in bond pads 54A and the corresponding overlying bond pads 154. The annealing temperature may be higher than about 350° C., and may be in the range between about 350° and about 550° C. in accordance with some embodiments. The annealing time may be in the range between about 1.5 hours and about 3.0 hours, and may be in the range between about 1.0 hour and about 2.5 hours in accordance with some embodiments. Through the hybrid bonding, bond pads 154 are bonded to the corresponding bond pads 54A through direct metal bonding caused by metal inter-diffusion.

FIG. 18 illustrates a cross-sectional view of bond pads 54 and 154 after the pre-bonding, and before the anneal. In accordance with some embodiments, bond pads 54 and 154 have the same width, and are vertically aligned. Accordingly, recesses 56 are joined to the respective recess 156. Since the illustrated recesses 56 may be parts of a first recess ring, and the illustrated recesses 156 may be parts of a second recess ring, the first and the second recess rings may be joined with each other to form a combined recess ring. In accordance with alternative embodiments, one of bond pads 54 and 154 do not have recesses (as shown in FIGS. 16B and 17B), and the other bond pad has the recess.

FIG. 19 illustrates a cross-sectional view of bond pads 54 and 154 after the anneal. Due to the inter-diffusion of bond pads 54 and 154, metallic material 50 is joined with metallic material 150. The formation of recesses 56 and 156 advantageously reduces the stress generated in the bonded structure. For example, the Coefficient of Thermal Expansion (CTE) of metallic materials 50 and 150 is significantly different from that of dielectric layers 42 and 142, and the recesses allow some space for the expansion of the metallic materials during thermal cycles (such as the pre-anneal and anneal). The stress suffered by the bonded structure is thus reduced.

After the anneal, there may be some recesses 56' in the bonded structure. The shapes and sizes of recesses 56' may be different from that of recesses 56 and 156 due to the diffusion of the metallic materials. For example, the size of recesses 56' may be smaller than the combined size of recesses 56 and 156 prior to anneal. The height of recesses 56' may be greater than about 50 Å, and may be in the range between about 50 Å and about 500 Å. In accordance with alternative embodiments, after the anneal, the recesses disappear. The shape of diffusion barriers 48 and 148 may also change to fit the reduction and the elimination of the recesses.

FIG. 20 illustrate a cross-sectional view of bond pads 54 and 154 after the pre-bonding and before the anneal in accordance with some embodiments, wherein bond pad 54 is vertically misaligned from bond pad 154. Accordingly, recesses 56 are misaligned from the corresponding recesses 156. FIG. 21 illustrates a cross-sectional view of bond pads 54 and 154 after the anneal. Due to the inter-diffusion of bond pads 54 and 154, metallic material 50 is joined with metallic material 150. In the cross-sectional view, the recesses 56 and 156 that face the middle portion of the other metal pad may be fully filled, or may be partially filled with reduced sizes. The recesses facing opposing dielectric layers 42 and 142 may remain. It is appreciated that the embodiments shown in FIGS. 19 and 21 may exist on the same package. For example, when rotational misalignment occurs, some bond pads are aligned to result in the structure shown in FIG. 19, and some other bond pads in the same package may misalign with each other to result in the structure shown in FIG. 21.

FIGS. 22 and 23 illustrate the bond pads before and after anneal, respectively, with bond pads 54 and 154 being aligned. Bond pad 54 has a size different from (greater than or smaller than) that of bond pad 154. For example, in the illustrated example, bond pad 154 is larger than bond pad 54. As a result, as shown in FIG. 23, after the bonding, the sizes of the recesses 56 (FIG. 22) are reduced or fully filled, while recesses 156 are not fully filled.

Figure 25:
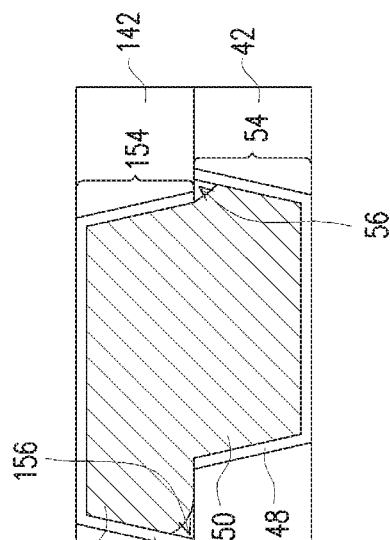
Figure 24:
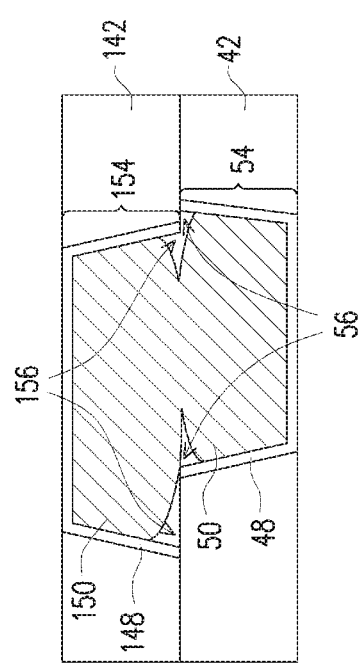

FIGS. 24 and 25 illustrate the bond pads before and after anneal, respectively, with bond pads 54 and 154 being misaligned. Bond pad 54 has a size different from (greater than or smaller than) that of bond pad 154. For example, in the illustrated example, bond pad 154 is larger than bond pad 54. As shown in FIG. 25, after the bonding, both the recesses 56 and 156 (FIG. 24) have some portions filled, and some other portions unfilled.

Referring back to FIG. 6, in accordance with some embodiments, after the bonding process, a backside grinding may be performed to thin device dies 112, for example, to a thickness between about 15 μm and about 30 μm. FIG. 6 schematically illustrates dashed lines 112-BS1, which are the back surfaces of device dies 112 before the backside grinding. 112-BS2 are the back surfaces of device dies 112 after the backside grinding. Through the thinning of device dies 112, the aspect ratio of gaps 53 is reduced in order to perform gap filling. Otherwise, the gap filling may be difficult due to the otherwise high aspect ratio of gaps 53. After the backside grinding, TSVs 116 may be revealed. Alternatively, TSVs 116 are not revealed at this time, and the backside grinding is stopped when there is a thin layer of substrate covering TSVs 116. In accordance with these embodiments, TSVs 116 may be revealed in the step shown in FIG. 8. In accordance with other embodiments in which the aspect ratio of gaps 53 is not too high, the backside grinding is skipped.

Figure 7:
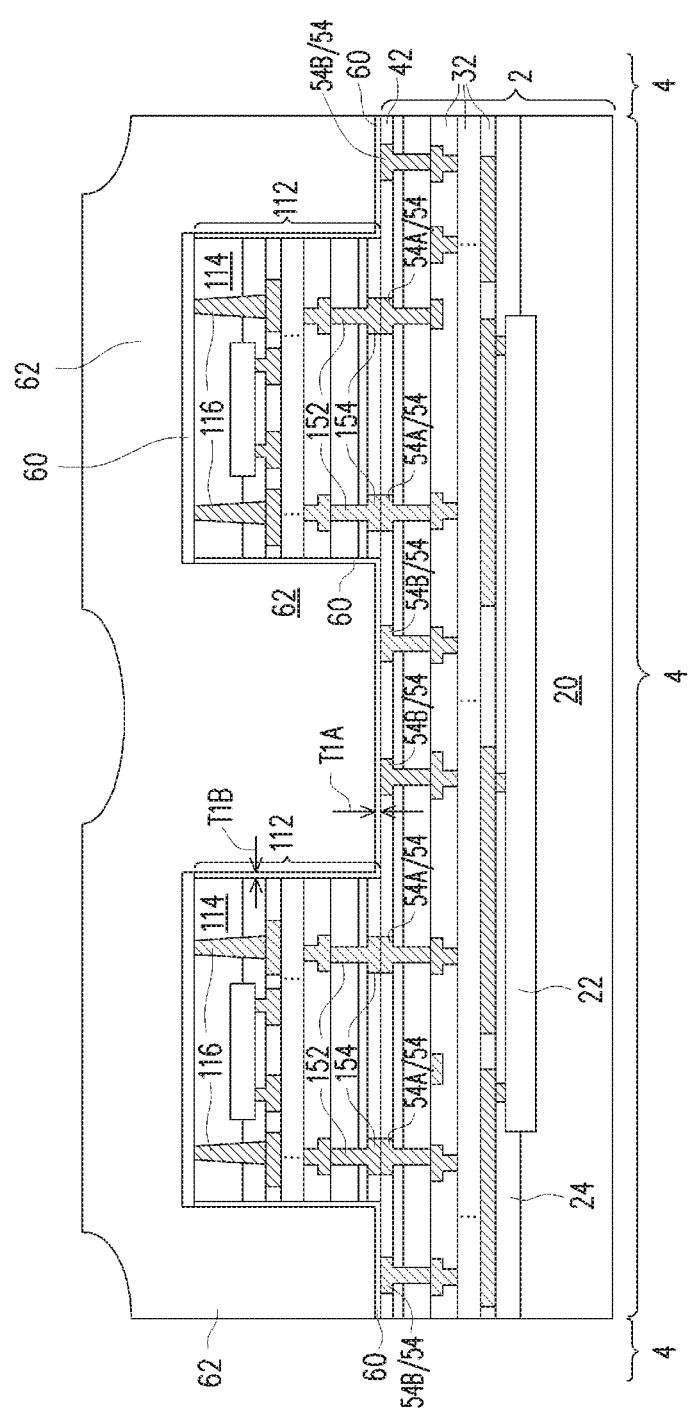

FIG. 7 illustrates the formation of gap-filling layers, which includes dielectric layer 62 and the underlying etch stop layer 60. The respective process is illustrated as step 214 in the process flow shown in FIG. 28. Etch stop layer 60 is formed of a dielectric material that has a good adhesion to the sidewalls of device dies 112 and the top surfaces of dielectric layer 42 and bond pads 54B. In accordance with some embodiments of the present disclosure, etch stop layer 60 is formed of a nitride-containing material such as silicon nitride. Etch stop layer 60 may be a conformal layer, for example, with the thickness T1A of horizontal portions and thickness T1B of the vertical portions being substantially equal to each other, for example, with the difference (T1A-T1B) having an absolute value smaller than about 20 percent, or smaller than about 10 percent, of both thicknesses T1A and T1B. The deposition may include a conformal deposition method such as Atomic Layer Deposition (ALD) or Chemical Vapor Deposition (CVD). When bond pads 54B have recesses 56 (FIG. 16A), etch stop layer 60 also extends into the recesses.

Dielectric layer 62 is formed of a material different from the material of etch stop layer 60. In accordance with some embodiments of the present disclosure, dielectric layer 62 is formed of silicon oxide, which may be formed of TEOS, while other dielectric materials such as silicon carbide, silicon oxynitride, silicon oxy-carbo-nitride, PSG, BSG, BPSG, or the like may also be used. Dielectric layer 62 may be formed using CVD, High-Density Plasma Chemical Vapor Deposition (HDPCVD), Flowable CVD, spin-on coating, or the like. Dielectric layer 62 fully fills the remaining gaps 53 (FIG. 6).

Figure 8:
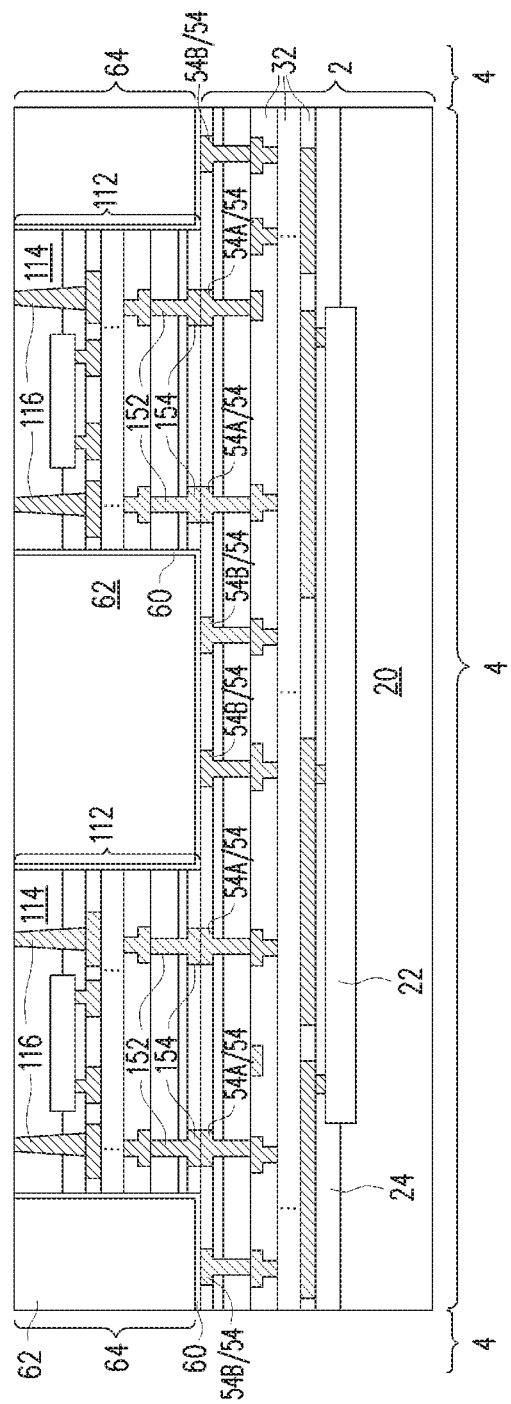

Referring to FIG. 8, a planarization process such as a CMP process or a mechanical grinding process is performed to remove excess portions of gap-filling layers 60 and 62, so that device dies 112 are exposed. The respective process is also illustrated as step 214 in the process flow shown in FIG. 28. Also, through-vias 116 are exposed. The remaining portions of layers 60 and 62 are collectively referred to as (gap-filling) isolation regions 64.

Figure 9:
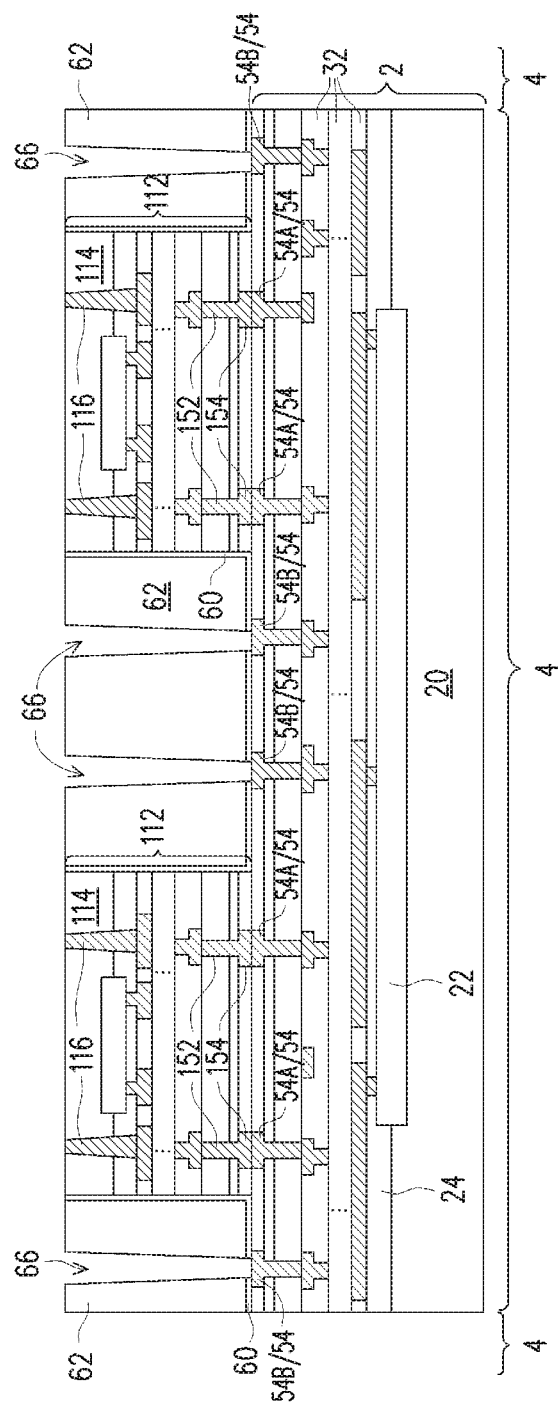

FIG. 9 illustrates the etching of dielectric layer 62 to form openings 66. The respective process is illustrated as step 216 in the process flow shown in FIG. 28. In accordance with some embodiments of the present disclosure, a photo resist (not shown) is formed and patterned, and dielectric layer 62 is etched using the patterned photo resist as an etching mask. Openings 66 are thus formed, and extend down to etch stop layer 60, which acts as the etch stop layer. In accordance with some embodiments of the present disclosure, dielectric layer 62 comprises an oxide, and the etching may be performed through dry etching. The etching gas may include a mixture of $NF_3$ and $NH_3$, or a mixture of HF and $NH_3$. Next, etch stop layer 60 is etched, so that openings 66 extend down to dielectric bond pads 54B. In accordance with some embodiments of the present disclosure, etch stop layer 60 is formed of silicon nitride, and the etching is performed using dry etching. The etching gas may include a mixture of $CF_4$, $O_2$, and $N_2$, a mixture of $NF_3$ and $O_2$, $SF_6$, or a mixture of $SF_6$ and $O_2$.

Figure 10:
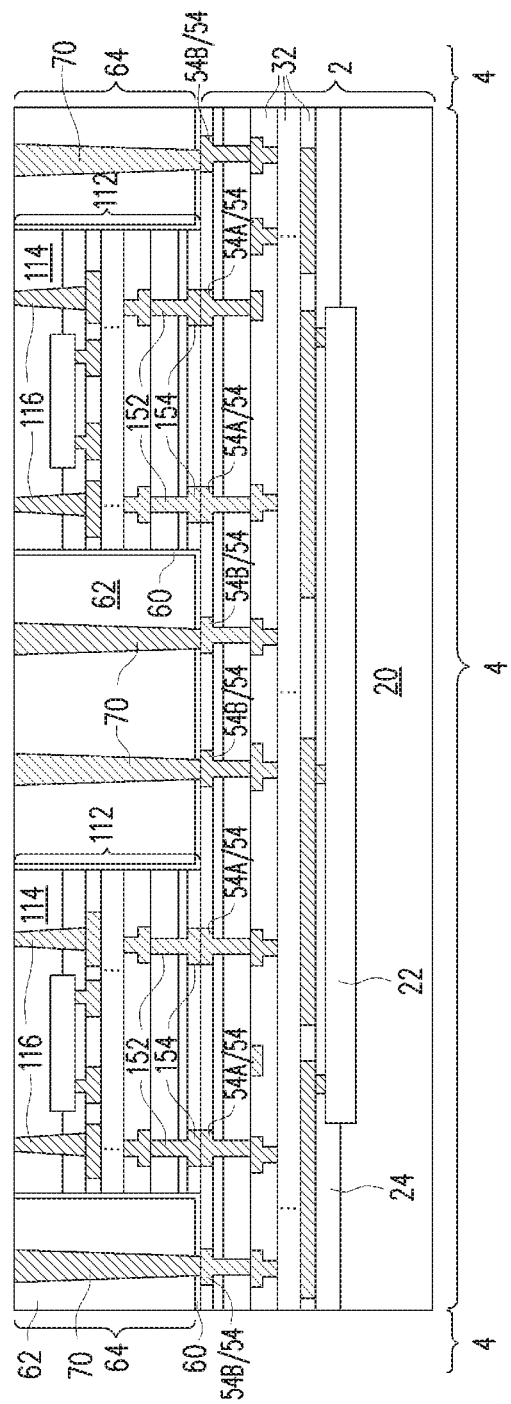

FIG. 10 illustrates the formation of through-vias 70, which fills openings 66 (FIG. 9), and are connected to bond pads 54B. The respective process is illustrated as step 218 in the process flow shown in FIG. 28. In accordance with some embodiments of the present disclosure, the formation of through-vias 70 includes performing a plating process such as an electrical-chemical plating process or an electro-less plating process. Through-vias 70 may include a metallic material such as tungsten, aluminum, copper, or the like. A conductive barrier layer (such as titanium, titanium nitride, tantalum, tantalum nitride, or the like) may also be formed underlying the metallic material. A planarization such as a CMP is performed to remove excess portions of the plated metallic material, and the remaining portions of the metallic material form through-vias 70. Through-vias 70 may have substantially straight and vertical sidewalls. Also, through-vias 70 may have a tapered profile, with top widths slightly greater than the respective bottom widths.

In accordance with alternative embodiments, TSVs 116 are not pre-formed in device dies 112. Rather, they are formed after the formation of isolation regions 64. For example, either before or after the formation of openings 66 (FIG. 8), device dies 112 are etched to form additional openings (occupied by the illustrated TSVs 116). The additional openings in device dies 112 and openings 66 may be filled simultaneously to form through TSVs 116 and through-vias 70. The resulting through-vias 116 may have upper portions wider than the respective lower portions, opposite to what are shown in FIG. 10.

Figure 11:
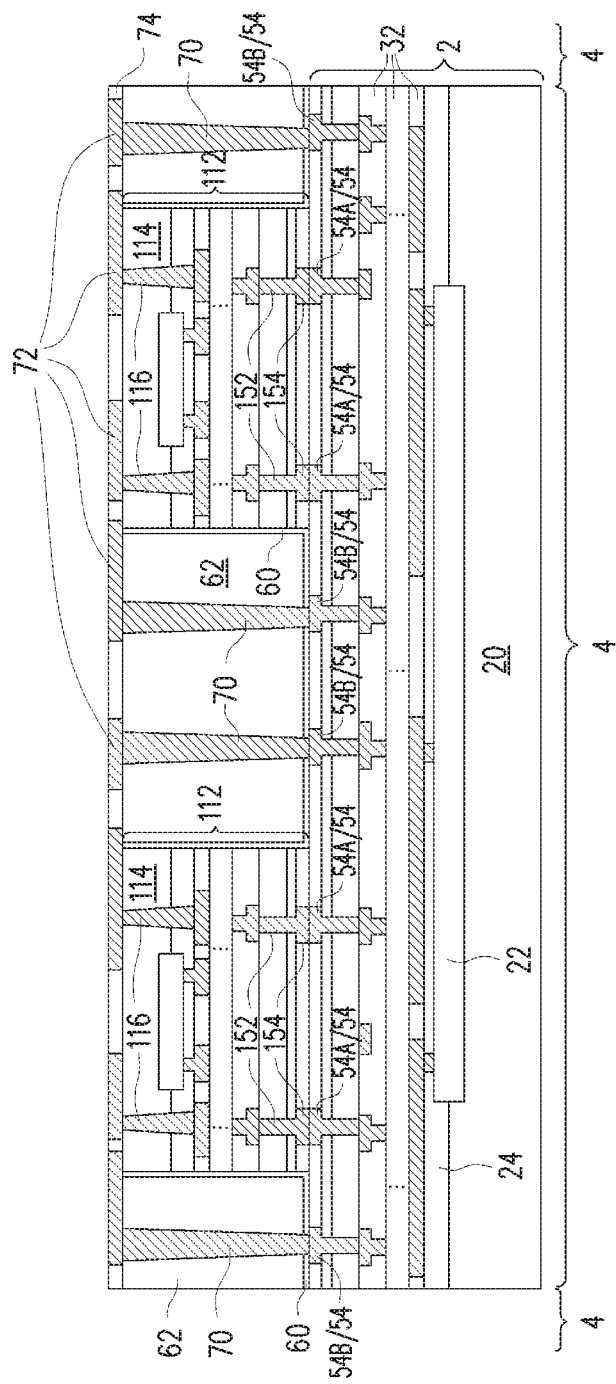

Referring to FIG. 11, redistribution lines (RDLs) 72 and dielectric layer 74 are formed. The respective process is illustrated as step 220 in the process flow shown in FIG. 28. In accordance with some embodiments of the present disclosure, dielectric layer 74 is formed of an oxide such as silicon oxide, a nitride such as silicon nitride, or the like. RDLs 72 may be formed using a damascene process, which includes etching dielectric layer 74 to form openings, depositing a conductive barrier layer into the openings, plating a metallic material such as copper or a copper alloy, and performing a planarization to remove the excess portions of the metallic material.

Figure 12:
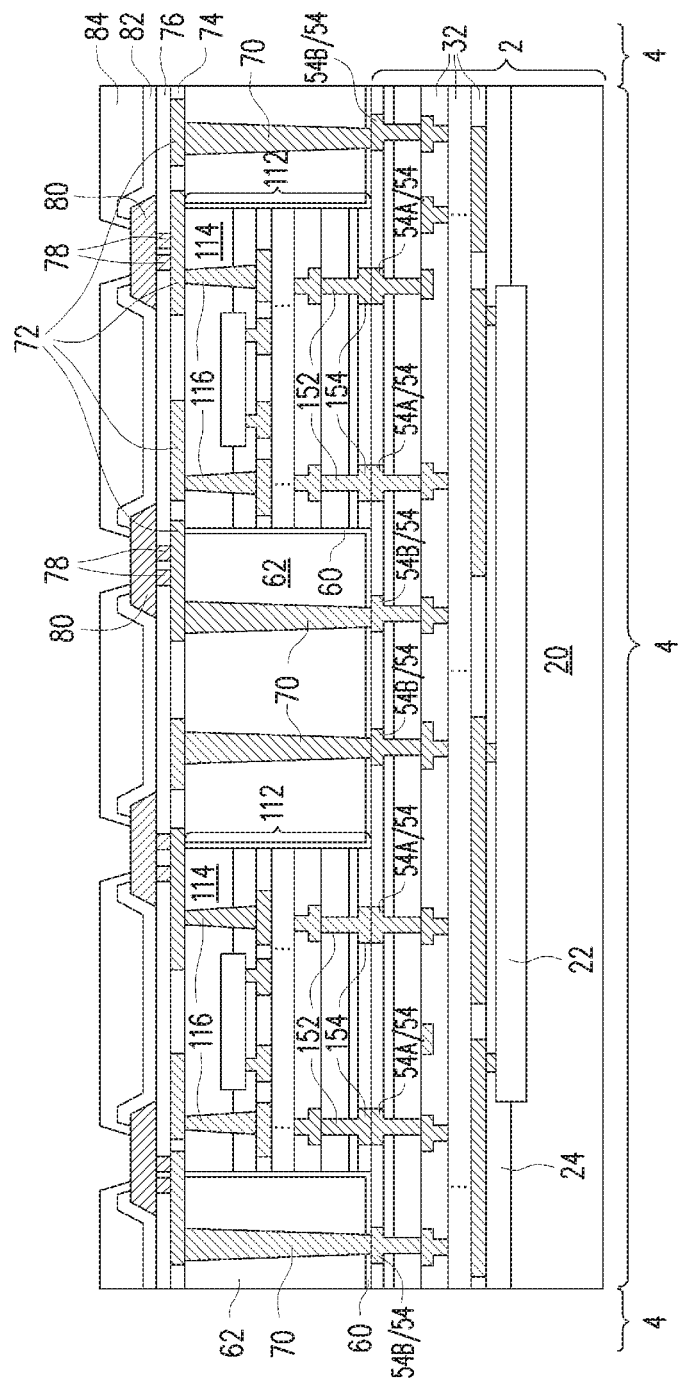

FIG. 12 illustrates the formation of passivation layers, metal pads, and overlying dielectric layers. The respective process is also illustrated as step 220 in the process flow shown in FIG. 28. Passivation layer 76 (sometimes referred to as passivation-1) is formed over dielectric layer 74, and vias 78 are formed in passivation layer 76 to electrically connect to RDLs 72. Metal pads 80 are formed over passivation layer 76, and are electrically coupled to RDLs 72 through vias 78. Metal pads 80 may be aluminum pads or aluminum-copper pads, and other metallic materials may be used.

As also shown in FIG. 12, passivation layer 82 (sometimes referred to as passivation-2) is formed over passivation layer 76. Each of passivation layers 76 and 82 may be a single layer or a composite layer, and may be formed of a non-porous material. In accordance with some embodiments of the present disclosure, one or both of passivation layers 76 and 82 is a composite layer including a silicon oxide layer (not shown separately), and a silicon nitride layer (not shown separately) over the silicon oxide layer. Passivation layers 76 and 82 may also be formed of other non-porous dielectric materials such as Un-doped Silicate Glass (USG), silicon oxynitride, and/or the like.

Next, passivation layer 82 is patterned, so that some portions of passivation layer 82 cover the edge portions of metal pads 80, and some portions of metal pads 80 are exposed through the openings in passivation layer 82. Polymer layer 84 is then formed, and then patterned to expose metal pads 80. Polymer layer 84 may be formed of polyimide, polybenzoxazole (PBO), or the like.

In accordance with some embodiments of the present disclosure, the structure underlying metal pads 80 is free from organic materials (such as polymer layers), so that the process for forming the structures underlying metal pads 80 may adopt the process used for forming device dies, and fine-pitches RDLs (such as 72) having small pitches and line widths are made possible.

Figure 13:
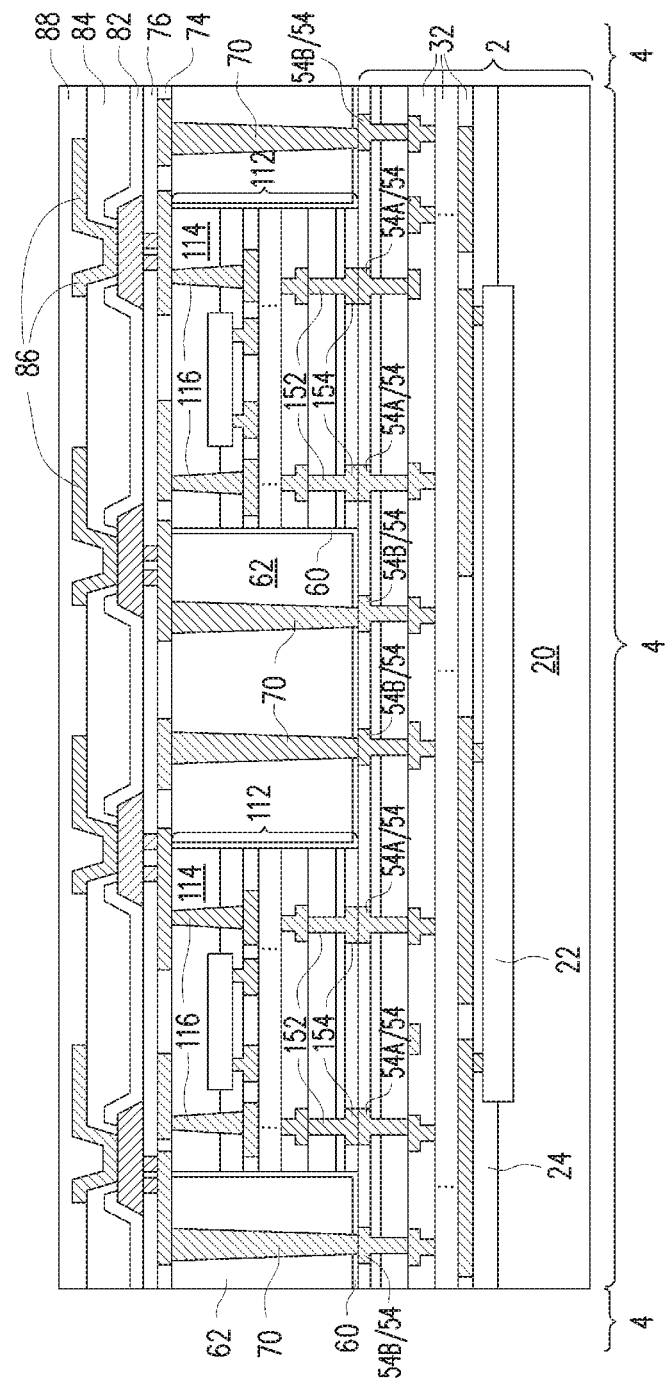

Referring to FIG. 13, Post-Passivation Interconnects (PPI) 86 are formed, which may include forming a metal seed layer and a patterned mask layer (not shown) over the metal seed layer, and plating PPIs 86 in the patterned mask layer. The patterned mask layer and the portions of the metal seed layer overlapped by the patterned mask layer are then removed in etching processes. Polymer layer 88 is then formed, which may be formed of PBO, polyimide, or the like.

Referring to 14, Under-Bump Metallurgies (UBMs) 90 are formed, and UBMs 90 extend into polymer layer 88 to connect to PPIs 86. The respective process is also illustrated as step 220 in the process flow shown in FIG. 28. In accordance with some embodiments of the present disclosure, each of UBMs 90 includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in UBMs 90.

Figure 14:
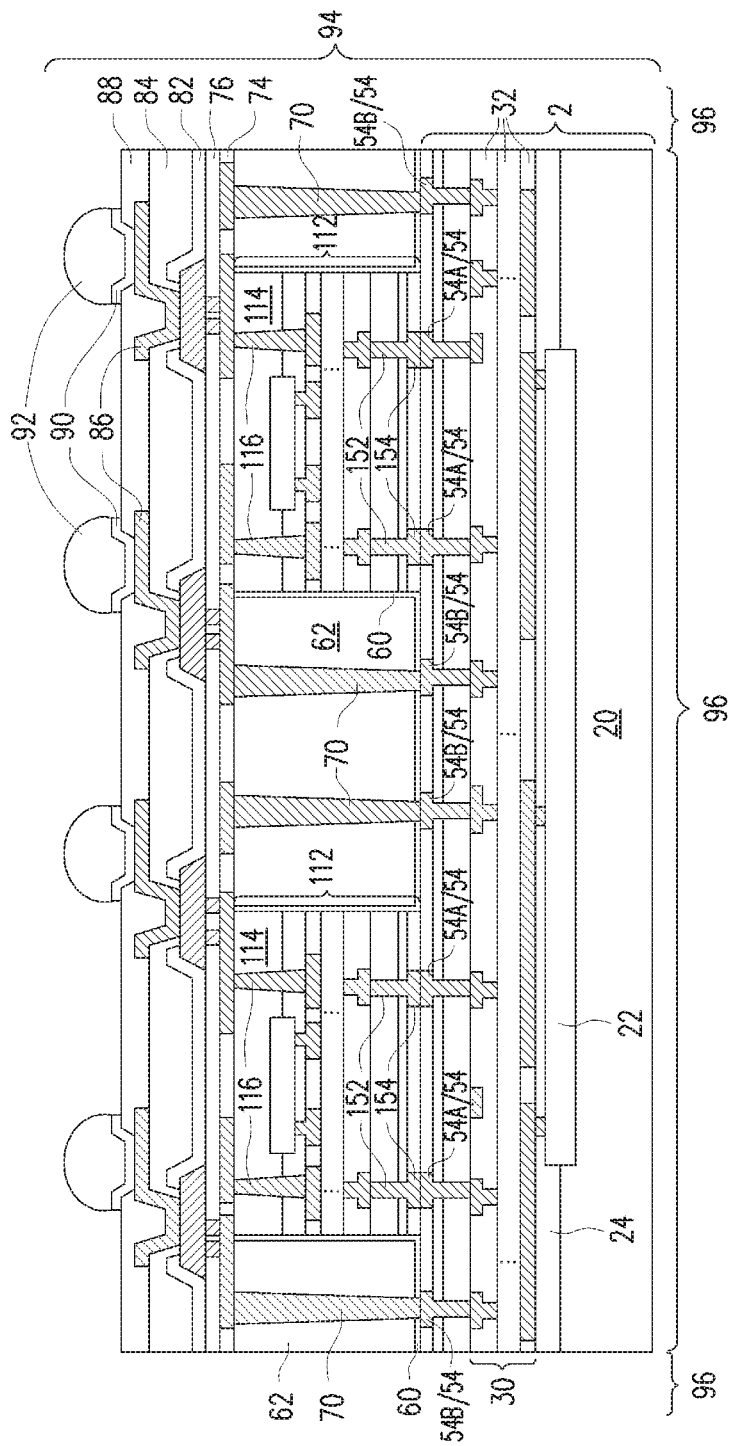

As also shown in FIG. 14, electrical connectors 92 are formed. The respective process is also illustrated as step 220 in the process flow shown in FIG. 28. An formation process for forming UBMs 90 and electrical connectors 92 includes depositing a blanket UBM layer, forming and patterning a mask (which may be a photo resist, not shown), with portions of the blanket UBM layer being exposed through the opening in the mask. After the formation of UBMs 90, the illustrated package is placed into a plating solution (not shown), and a plating step is performed to form electrical connectors 92 on UBMs 90. In accordance with some embodiments of the present disclosure, electrical connectors 92 include non-solder parts (not shown), which are not molten in the subsequent reflow processes. The non-solder parts may be formed of copper, and hence are referred to as copper bumps hereinafter, although they may be formed of other non-solder materials. Each of electrical connectors 92 may also include cap layer(s) (not shown) selected from a nickel layer, a nickel alloy, a palladium layer, a gold layer, a silver layer, or multi-layers thereof. The cap layer(s) are formed over the copper bumps. Electrical connectors 92 may further include solder caps, which may be formed of a Sn—Ag alloy, a Sn—Cu alloy, a Sn—Ag—Cu alloy, or the like, and may be lead-free or lead-containing. The structure formed in preceding steps is referred to as composite wafer 94. A die-saw (singulation) step is performed on composite wafer 94 to separate composite wafer 94 into a plurality of packages 96. The respective process is illustrated as step 222 in the process flow shown in FIG. 28.

Figure 15:
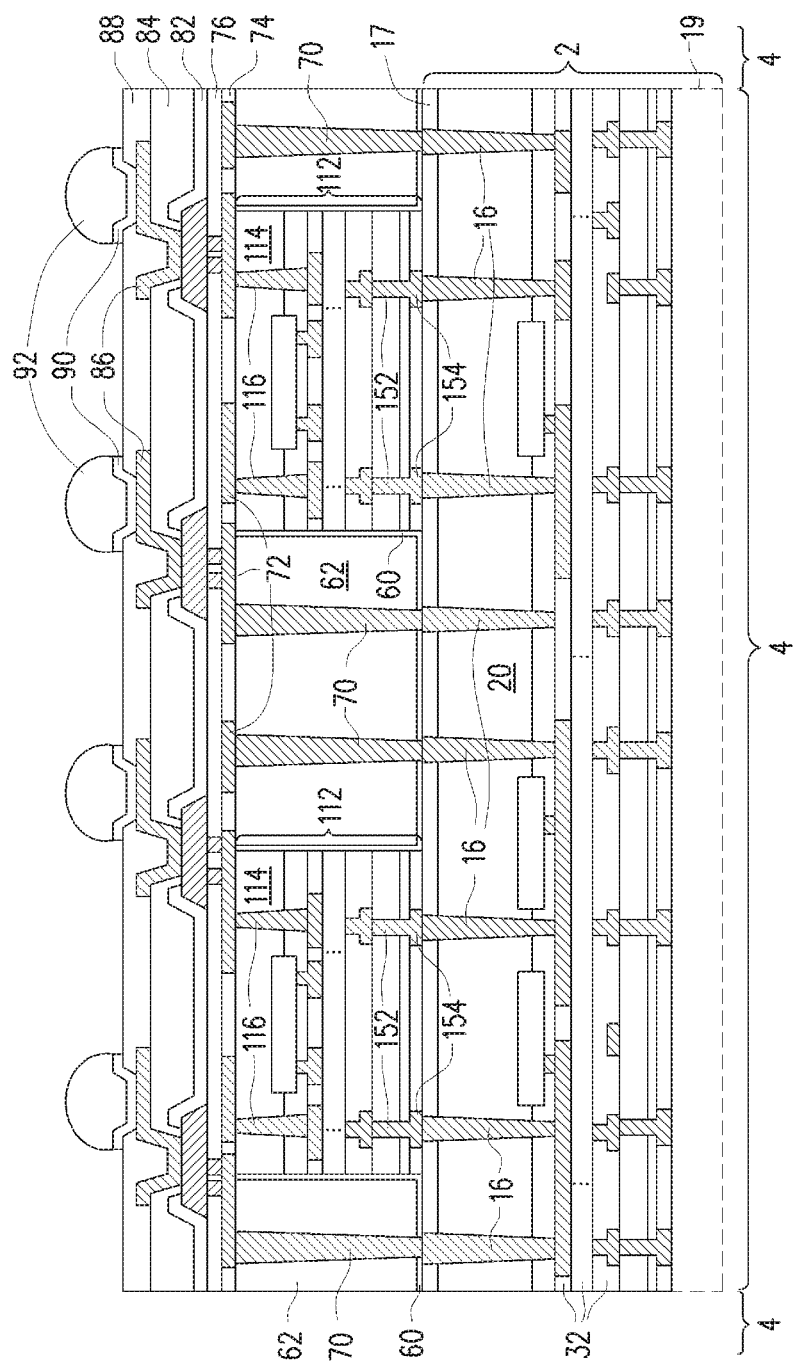
FIG. 15 illustrates the cross-sectional view of a package formed through face-to-back bonding in accordance with some embodiments.

The package shown in FIG. 14 has a face-to-face structure, in which device dies 112 have their front surfaces facing the front surface of device die 4. FIG. 15 illustrates a face-to-back structure, in which device dies 112 have their front surfaces facing the back surface of device die 4. Device die 4 includes TSVs 16, which extends through substrate 20 and dielectric layer 17. The dashed region 19 in FIG. 15 represents the likely electrical connectors such as solder regions. In accordance with some embodiments of the present disclosure, a CMP is performed on TSVs 16 and dielectric layer 17. The details of the CMP process may be similar to what are discussed referring to FIG. 16A, and hence recesses 156 are formed, as shown in FIG. 25.

Figure 27:
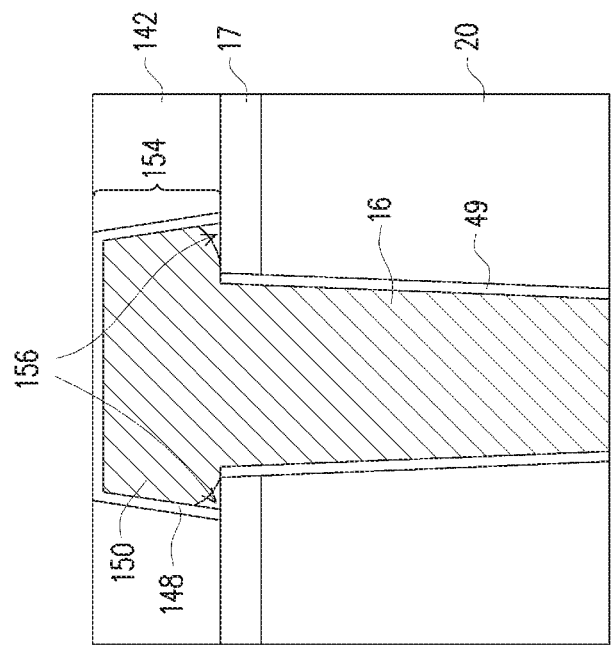
Figure 26:
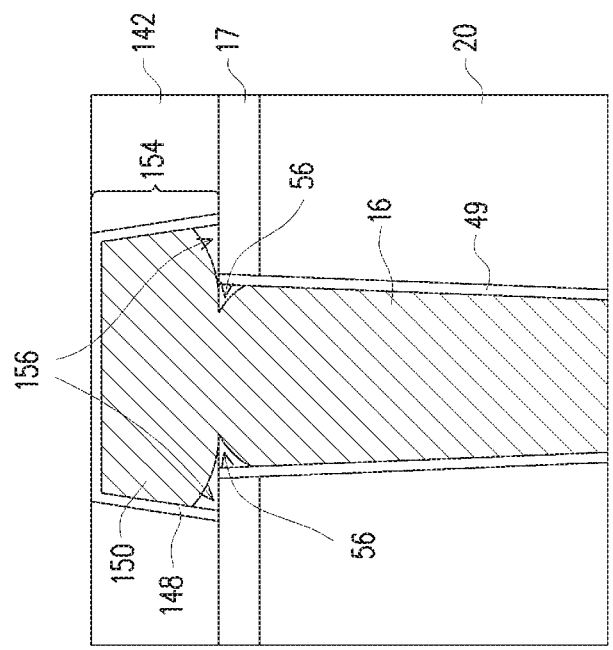

FIGS. 26 and 27 illustrate the bonding of bond pads 154 with TSVs 16, with FIG. 26 illustrating the structure before an anneal, and FIG. 27 illustrates the structure after the anneal. Layer 49 in FIG. 26 may be a dielectric isolation layer, which may be formed of silicon oxide, silicon nitride, or the like. Recesses 56 may be formed in TSVs 16, which recesses are either reduced or fully eliminated after the anneal. Recesses 156 may still exist after the anneal.

The embodiments of the present disclosure have some advantageous features. By forming recesses in bond pads, the stress in the bonded structures is reduced, particularly in thermal cycles. The reliability of the bonded structure is thus improved.

In accordance with some embodiments of the present disclosure, a method includes forming a first device die comprising: depositing a first dielectric layer; and forming a first metal pad in the first dielectric layer, wherein the first metal pad comprises a first recess adjacent to an edge portion of the first metal pad; forming a second device die comprising: a second dielectric layer; and a second metal pad in the second dielectric layer; and bonding the first device die to the second device die, wherein the first dielectric layer is bonded to the second dielectric layer, and the first metal pad is bonded to the second metal pad. In an embodiment, the first metal pad comprises: a diffusion barrier; and a copper-containing material between opposite portions of the diffusion barrier, wherein an edge portion of the copper-containing material is recessed lower than a top edge of the diffusion barrier layer to form the first recess. In an embodiment, the bonding comprises: performing a pre-anneal; and performing an anneal, wherein during the anneal, the first recess is reduced. In an embodiment, the forming the first metal pad comprises performing a planarization, wherein the first recess is generated by the planarization. In an embodiment, the planarization comprises a Chemical Mechanical Polish (CMP) performed using a slurry having a pH value lower than about 4.0. In an embodiment, the CMP is performed using a slurry comprising an acetic acid and a copper chelate. In an embodiment, the second metal pad comprises a second recess adjacent to an edge of the second metal pad, and the first recess is joined to the second recess at a time the bonding is started. In an embodiment, the second metal pad comprises a second recess adjacent to an edge of the second metal pad, and the first recess is separated from the second recess at a time the bonding is started, and after the bonding, the first recess remains, and the second recess disappears.

In accordance with some embodiments of the present disclosure, a method includes forming a dielectric layer on a top surface of a wafer; etching the dielectric layer to form a trench in the dielectric layer; and forming a first metal pad in the trench, wherein the first metal pad comprises: a diffusion barrier contacting the dielectric layer; and a metallic material between opposite portions of the diffusion barrier, wherein in a cross-sectional view of the first metal pad, a top surface of the metallic material comprises a middle portion, and edge portions lower than the middle portion, and the edge portions are lower than a top edge of a nearest portion of the diffusion barrier to form a recess. In an embodiment, the method further includes bonding a second metal pad to the first metal pad, wherein the recess is at least reduced in size. In an embodiment, the method further includes forming a dielectric etch stop layer extending into the recess; and forming a through-via penetrating through the dielectric etch stop layer to connect to the first metal pad. In an embodiment, the forming the first metal pad comprises a CMP, and the recess is formed during the CMP. In an embodiment, the CMP is performed using a slurry, and the slurry has a pH value in a range between about 2.0 and about 4.0. In an embodiment, the top surface of the metallic material is curved.

In accordance with some embodiments of the present disclosure, a device includes a first device die comprising: a first dielectric layer; and a first metal pad comprising: a diffusion barrier contacting the first dielectric layer; and a metallic material between opposite portions of the diffusion barrier, wherein in a cross-sectional view of the first metal pad, an edge portion of the metallic material is recessed than a top edge of a nearest portion of the diffusion barrier to form an air gap; and a second device die comprising: a second dielectric layer bonded to the first dielectric layer through fusion bonding; and a second metal pad bonded to the first metal pad through metal-to-metal direct bonding. In an embodiment, the air gap further extends into the second metal pad. In an embodiment, the air gap is formed between a sidewall of the diffusion barrier, a surface of the metallic material, and a surface of the second metal pad. In an embodiment, the air gap is formed between a sidewall of the diffusion barrier, a surface of the metallic material, and a surface of the second dielectric layer. In an embodiment, a surface of the metallic material facing the air gap is rounded. In an embodiment, the first device die further comprises a third metal pad comprising an additional recess, and the device further includes a dielectric etch stop layer extending into the additional recess; a dielectric layer over and contacting the dielectric etch stop layer; and a through-via penetrating through the dielectric etch stop layer and the dielectric layer to connect to the third metal pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first device die comprising:
        depositing a first dielectric layer; and
        forming a first metal pad in the first dielectric layer, wherein the first metal pad comprises a first recess adjacent to an edge portion of the first metal pad;
    forming a second device die comprising:
        depositing a second dielectric layer; and
        forming a second metal pad in the second dielectric layer, wherein the second metal pad comprises a second recess adjacent to an edge of the second metal pad; and
    bonding the first device die to the second device die, wherein the first dielectric layer is bonded to the second dielectric layer, and the first metal pad is bonded to the second metal pad, wherein the first recess is separated from the second recess at a time the bonding is started, and after the bonding, the first recess remains, and the second recess fully disappears.

2. The method of claim 1, wherein the first metal pad comprises:
    a diffusion barrier; and
    a copper-containing material between opposite portions of the diffusion barrier, wherein an edge portion of the copper-containing material is recessed lower than a top edge of the diffusion barrier to form the first recess.

3. The method of claim 1, wherein the bonding comprises:
    performing a pre-anneal; and performing an anneal, wherein during the anneal, the first recess is reduced.

4. The method of claim 1, wherein the forming the first metal pad comprises performing a planarization, wherein the first recess is generated by the planarization.

5. The method of claim 4, wherein the planarization comprises a Chemical Mechanical Polish (CMP) performed using a slurry having a pH value lower than about 4.0 and greater than about 2.0.

6. The method of claim 4, wherein the planarization comprises a Chemical Mechanical Polish (CMP) performed using a slurry comprising an acetic acid and a copper chelate.

7. The method of claim 1, wherein after the bonding, all of the first recess extend beyond edges of the second metal pad.

8. A method comprising:
forming a dielectric layer on a top surface of a substrate;
etching the dielectric layer to form a first trench and a second trench in the dielectric layer;
forming a first metal pad and a second metal pad in the first trench and the second trench, respectively, wherein each of the first metal pad and the second metal pad comprises:
 a diffusion barrier contacting the dielectric layer; and
 a metallic material between opposite portions of the diffusion barrier, wherein in a cross-sectional view of the first metal pad, a top surface of the metallic material comprises a middle portion, and edge portions lower than the middle portion, and the edge portions are lower than a top edge of a nearest portion of the diffusion barrier to form a recess;
forming a dielectric etch stop layer extending into the recess of the second metal pad; and
forming a through-via penetrating through the dielectric etch stop layer to connect to the second metal pad.

9. The method of claim 8 further comprising bonding a third metal pad to the first metal pad, wherein the recess is at least reduced in size after the bonding of the third metal pad to the first metal pad.

10. The method of claim 8, wherein the forming the first metal pad comprises a Chemical Mechanical Polish (CMP), and the recess of the first metal pad and the recess of the second metal pad are formed during the CMP.

11. The method of claim 10, wherein the CMP is performed using a slurry, and the slurry has a pH value in a range between about 2.0 and about 4.0.

12. The method of claim 8, wherein the top surface of the metallic material is curved.

13. A method comprising:
forming a dielectric layer on a top surface of a substrate;
etching the dielectric layer to form a trench in the dielectric layer;
depositing a diffusion barrier extending into the trench;
depositing a metallic material on the diffusion barrier;
performing a chemical mechanical polish on the metallic material and the diffusion barrier, wherein remaining portion of the metallic material and the diffusion barrier form a metal pad, and wherein a recess extends into the metal pad;
contacting an additional metal pad to the metal pad, wherein an additional recess extends into the additional metal pad, and wherein the recess is joined with the additional recess; and
performing an annealing process to bond the metal pad to the additional metal pad, wherein after the annealing process, the recess is reduced in size, and the additional recess fully disappears.

14. The method of claim 13, wherein the chemical mechanical polish is performed using a slurry comprising oxalic acid ($H_2C_2O_4$) and acetic acid ($CH_3COOH$).

15. The method of claim 13, wherein the metallic material in the metal pad comprises a top surface comprising a first portion, and a second portion as a ring encircling the first portion, wherein the second portion is lower than the first portion by a depth in a range between about 100 Å and about 500 Å.

16. The method of claim 14, wherein a weight percentage of the oxalic acid in the slurry is in a range between about 0.01% percent and about 2% percent.

17. The method of claim 14, wherein a weight percentage of the acetic acid in the slurry is in a range between about 0.1% percent and about 2% percent.

18. The method of claim 13, wherein after the annealing process, an entirety of the recess extends laterally beyond edges of the additional metal pad.

19. The method of claim 14, wherein the slurry further comprises Cu-oxalic chelate (Cu—$C_2O_4$).

20. The method of claim 13, wherein the chemical mechanical polish is performed using a slurry having a pH value lower than about 4.0.

* * * * *